US007885301B2

(12) United States Patent
Curtin et al.

(10) Patent No.: US 7,885,301 B2
(45) Date of Patent: Feb. 8, 2011

(54) LASER SAFETY SYSTEM

(75) Inventors: Mark S. Curtin, Simi Valley, CA (US);
Kenneth C. Widen, Topanga, CA (US)

(73) Assignee: The Boeing Company, Chicago, IL (US)

( * ) Notice: Subject to any disclaimer, the term of this patent is extended or adjusted under 35 U.S.C. 154(b) by 13 days.

(21) Appl. No.: 12/403,977

(22) Filed: Mar. 13, 2009

(65) Prior Publication Data

US 2010/0232463 A1    Sep. 16, 2010

(51) Int. Cl.
H01S 3/00    (2006.01)
(52) U.S. Cl. .................................. 372/38.09
(58) Field of Classification Search ............ 372/38.09, 372/70, 67, 81
See application file for complete search history.

(56) References Cited

U.S. PATENT DOCUMENTS

| 4,733,400 | A |   | 3/1988  | Thyzel et al.       |
|-----------|---|---|---------|---------------------|
| 4,812,641 | A | * | 3/1989  | Ortiz, Jr. ...... 250/205 |
| 5,280,536 | A |   | 1/1994  | Dumond et al.       |
| 6,043,872 | A |   | 3/2000  | Nagata              |
| 6,194,707 | B1|   | 2/2001  | Yang                |
| 6,744,792 | B1| * | 6/2004  | Tayebati ........ 372/32 |
| 6,952,531 | B2|   | 10/2005 | Aronson et al.      |
| 7,058,310 | B2|   | 6/2006  | Aronson et al.      |

FOREIGN PATENT DOCUMENTS

| DE | 10147798 A1 | 3/2003 |
| DE | 1677394 A1  | 7/2006 |
| EP | 1375052 A1  | 1/2004 |

OTHER PUBLICATIONS

European Patent Office (International Searching Authority) International Search Report and Written Opinion for International Patent Application PCT/US2010/024311, Sep. 27, 2010.

* cited by examiner

Primary Examiner—Minsun Harvey
Assistant Examiner—Patrick Stafford
(74) Attorney, Agent, or Firm—Klintworth & Rozenblatt IP LLC

(57) ABSTRACT

A computer may include a database and a power reducing routine. The database may be configured to store an input power level of an input laser beam transmitted onto and storing power within a gain module. The database may be further configured to store a discharge power level of at least partially discharged stored power discharged from the gain module through an output laser beam. The database may also be configured to store a power safety differential limit. The power reducing routine may include an algorithm. The algorithm may be configured to calculate a power differential by subtracting the discharge power level from the input power level, and to at least one of reduce power to and shut down the input laser beam if the calculated power differential exceeds the power safety differential limit.

25 Claims, 4 Drawing Sheets

LASER SAFETY SYSTEM

FIELD OF THE DISCLOSURE

The field of the disclosure relates to laser safety systems.

BACKGROUND OF THE DISCLOSURE

High power solid state lasers often achieve high power by integrating multiple gain-modules within a common resonator thus benefiting from industrial production capability limited to lower power gain modules. Thin disk laser gain modules may be sized by commercial laser welding needs and are typically limited to 4-5 Kw single disk designs. Scaling to higher power levels is generally achieved by integrating multiple single-disk modules into a common resonator, thus achieving a power multiplier associated with the number of gain modules incorporated into the high power resonator. Multiple-gain module scaling architectures may experience problems associated with build-up of amplified spontaneous emission (ASE) within the thin-disk gain element leading to high intensities within the gain material and eventual catastrophic destruction of the crystal.

The safety of the individual crystals is dependent on a delicate balance between absorbed pump power and extracted laser power across the pumped region of the disks/crystals. When the high-power multi-gain module resonator is efficiently extracting energy from each laser crystal the individual disks/crystals are relatively safe from the ASE damage mechanism. However, if this efficient extraction is interrupted all of the disks/crystals within the high-power resonator are at risk for catastrophic failure. Various scenarios can be envisioned which may lead to interruption of efficient extraction within the high-power resonator. These may include failure of a resonator fold mirror, failure of a single gain module, since a thin disk crystal acts as a resonator mirror, dust contaminant interrupting the beam, and other events.

Many of the existing solutions are not capable of reliably shutting down the laser within a short enough time to preserve the gain-media conditions at the time of initial damage. One of the existing solutions is the incorporation of helper resonators that run concurrent with the high-power main resonator and act as a fast analog optical system to maintain efficient power extraction from the thin disks should the high-power resonator cease efficient lasing. However, this first line of defense can be compromised under potential loss-of-lasing scenarios. Damage scenarios that involve initial damage to intra-cavity optical elements within the high-power resonator can create enough optical loss within the high-power resonator to create a condition of poor extraction efficiency from the thin disk by the main resonator. Under this condition the helper resonators are designed to power up to maintain the efficient extraction from each disk. However, if the initial cause of the main resonator loss of lasing also affected helper resonators they may not achieve the necessary intra-cavity intensity fast enough to prevent additional disk/crystal destruction.

An apparatus and method is needed which may solve one or more problems of one or more of the conventional laser safety systems and/or methods of operating a laser safety system.

SUMMARY OF THE DISCLOSURE

In one embodiment, a laser safety system may be provided. The laser safety system may comprise at least one gain module, at least one input device, at least one output device, and at least one computer. The at least one gain module may be for absorbing at least one input laser beam to store power within the at least one gain module, and for at least partially discharging the stored power through at least one output laser beam. The at least one input device may be for transmitting the at least one input laser beam onto the at least one gain module. The at least one output device may be for transmitting the at least one output laser beam off of the at least one gain module in order to at least partially discharge the stored power from the at least one gain module through the at least one output laser beam. The at least one computer may comprise at least one database and at least one power reducing routine. The at least one database may be configured to store an input power level of the at least one input laser beam, to store a discharge power level of the at least partially discharged stored power discharged through the at least one output laser beam, and to store a power safety differential limit. The at least one power reducing routine may comprise at least one algorithm configured to calculate a power differential by subtracting the discharge power level from the input power level, and to at least one of reduce power to and shut down the at least one input device if the calculated power differential exceeds the power safety differential limit.

In another embodiment, a method may be disclosed of operating a laser system. In one step, at least one input laser beam may be transmitted onto at least one gain module. In another step, the transmitted at least one input laser beam may be absorbed using the at least one gain module to store power within the at least one gain module. In an additional step, at least one output laser beam may be transmitted off the at least one gain module to at least partially discharge the stored power within the at least one gain module through the at least one output laser beam. In another step, a determination may be made as to an input power level of the at least one input laser beam, and as to a discharge power level of the at least partially discharged stored power discharged through the at least one output laser beam. In still another step, a power differential may be calculated by subtracting the discharge power level from the input power level. In another step, power to the at least one input laser beam may be at least one of reduced and shut down if the calculated power differential exceeds a power safety differential limit.

In an additional embodiment, at least one computer may comprise at least one database and at least one power reducing routine. The at least one database may be configured to store an input power level of at least one input laser beam transmitted onto and storing power within at least one gain module. The at least one database may be further configured to store a discharge power level of at least partially discharged stored power discharged from the at least one gain module through at least one output laser beam. The at least one database may also be configured to store a power safety differential limit. The at least one power reducing routine may comprise at least one algorithm. The at least one algorithm may be configured to calculate a power differential by subtracting the discharge power level from the input power level, and to at least one of reduce power to and shut down the at least one input laser beam if the calculated power differential exceeds the power safety differential limit.

One or more embodiments of the disclosure may provide one or more of the following benefits: reduce the probability of multiple disk failures in the event of a loss of lasing within a high-power resonator; provide for the shut-down of the laser fast enough to preserve the conditions within the gain media directly following damage initiation thus enabling relatively straight forward determination of the root-cause damage mechanism; act to protect high-power system elements and offer a second level of defense against multiple failure scenarios; avoid optical component damage scenarios; allow for a significant reduction in laser parts-count through the elimination of "protector-resonators" which serve similar functions; and/or may reduce and/or eliminate other types of problems.

These and other features, aspects and advantages of the disclosure will become better understood with reference to the following drawings, description and claims.

DETAILED DESCRIPTION OF THE DISCLOSURE

The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 1:
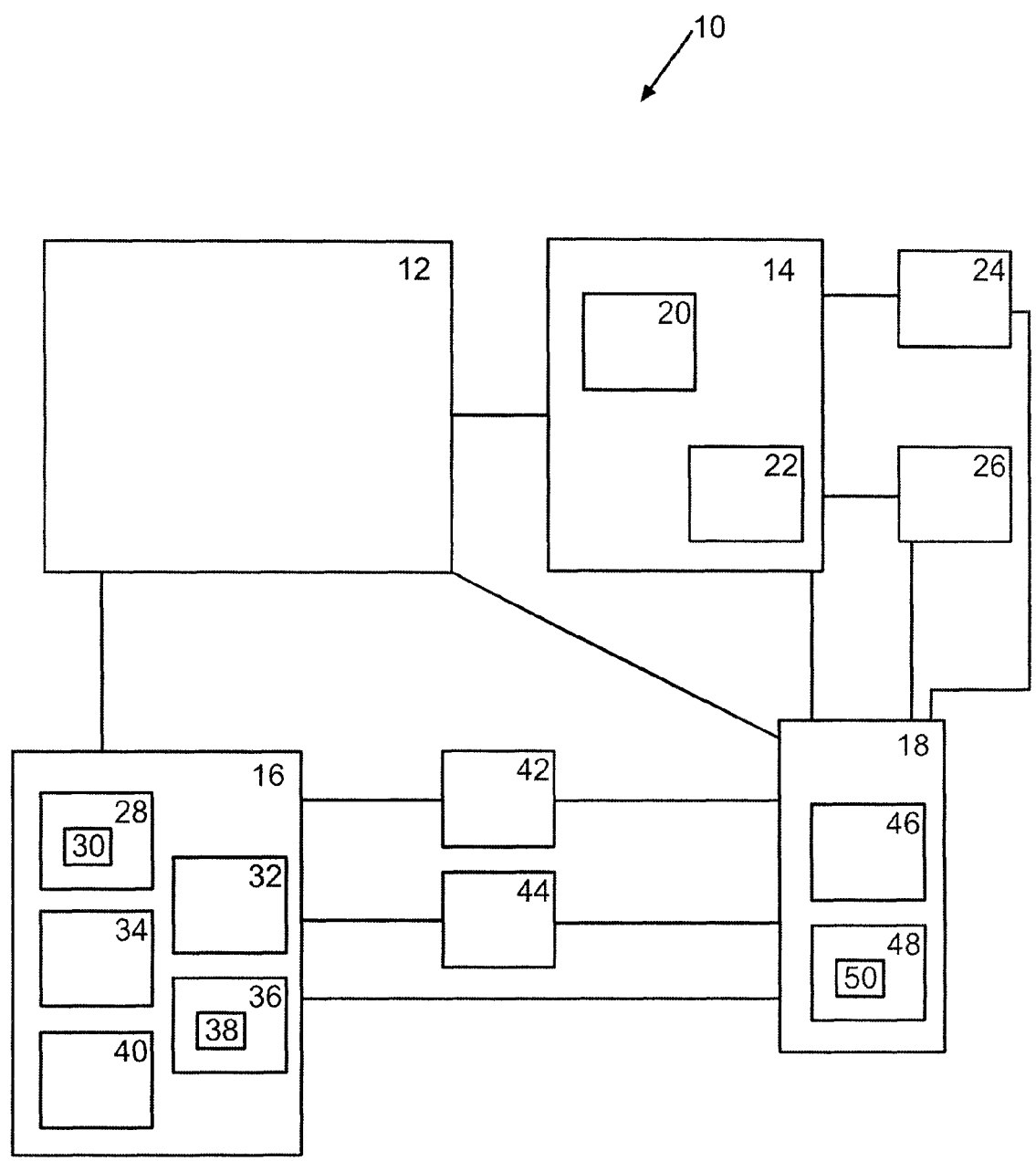
FIG. 1 illustrates a simplified box diagram of one embodiment of a laser safety system.

FIG. 1 illustrates a simplified box diagram of one embodiment of a laser safety system 10. The laser safety system 10 may comprise at least one gain module 12, at least one input device 14, at least one output device 16, and at least one computer 18. The at least one gain module 12 may comprise at least one thin laser disk. The at least one input device 14 may comprise one or more pump modules 20 and/or one or more pump mirrors 22. A reading device 24 and/or a detection device 26 may be in communication with the at least one input device 14. The at least one output device 16 may comprise any of a main resonator outcoupler 28, comprising a partially transmitting mirror 30, one or more fully reflecting fold mirrors 32, and/or one or more high reflector fully reflecting mirrors 34. The at least one output device 16 may further comprise any of at least one helper outcoupler 36, comprising at least one partially transmitting mirror 38, and/or at least one helper high reflector fully reflecting mirror 40. A main resonator photo detector 42 and/or one or more helper photo detectors 44 may be in communication with the at least one output device 16. The at least one computer 18 may comprise at least one database 46, and at least one power reducing routine 48 comprising at least one algorithm 50. In other embodiments, one or more of the at least one gain module 12, the at least one input device 14, the at least one output device 16, and the at least one computer 18 may vary in number, type, and/or components.

Figure 2:
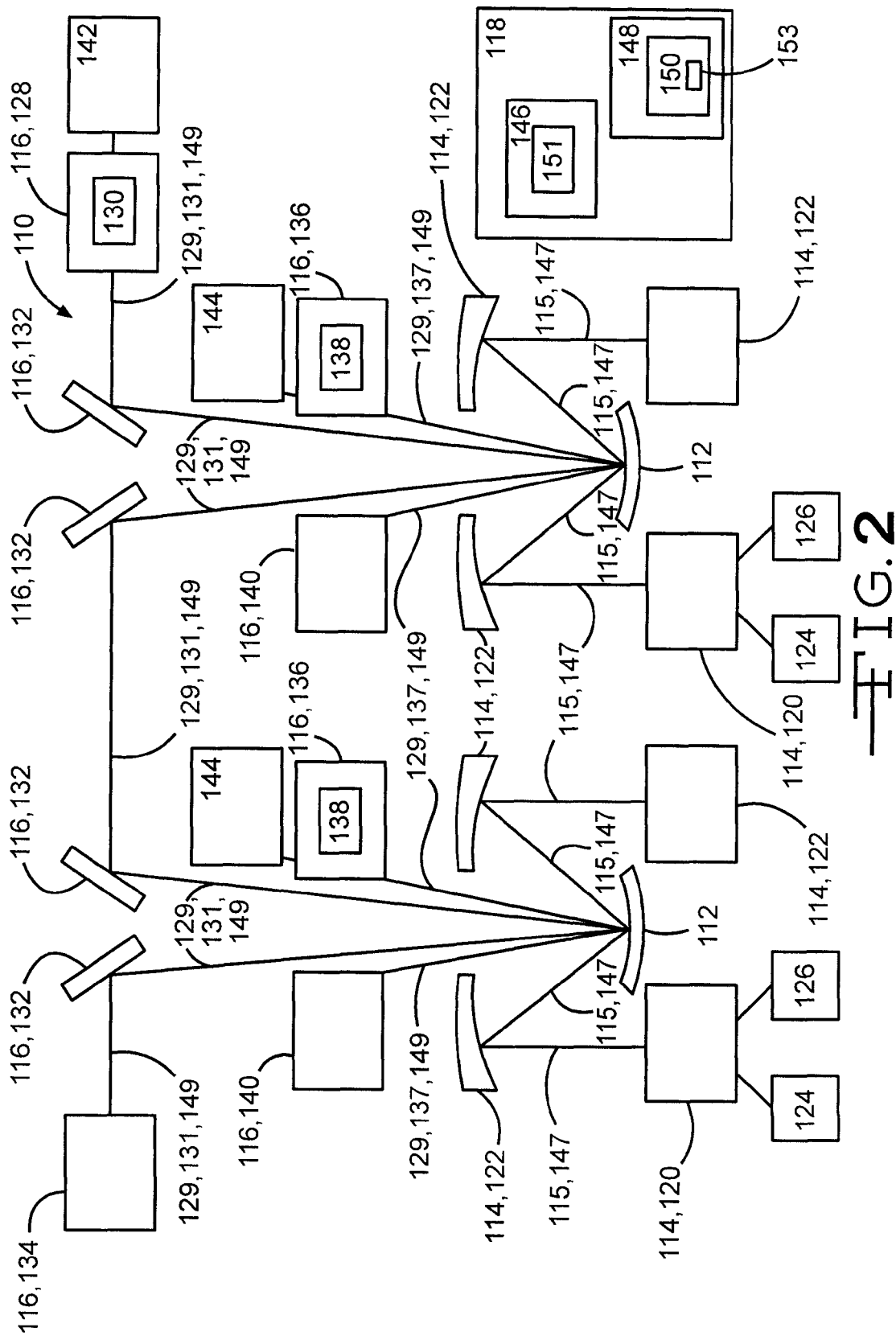
FIG. 2 illustrates a functional box diagram of another embodiment of a laser safety system.

FIG. 2 illustrates a functional box diagram of another embodiment of a laser safety system 110. As shown, the laser safety system 110 may comprise gain modules 112, input devices 114, output devices 116, and at least one computer 118. The gain modules 112 may comprise thin laser discs. In other embodiments, any number of gain modules 112 may be used. The input devices 114 may comprise pump modules 120 and pump mirrors 122. The input devices 114 may transmit input laser beams 115 onto the gain modules 112. The pump modules 120 may transmit input laser beams 115. The pump mirrors 122 may reflect the transmitted input laser beams 115 to the gain modules 112. The gain modules 112 may absorb the reflected input laser beams 115 to store power within the gain modules 112. In other embodiments, one or more pump modules 120 may be used, and the pump mirrors 122 may not be necessary. In still other embodiments, any number and type of input devices 114 may be used utilizing varying numbers and types of components to transmit varying numbers and types of input laser beams 115. A reading device 124 and/or a detection device 126 may be in communication with the input devices 114. The reading device 124 and/or the detection device 126 may be in communication with the pump modules 120 for determining the input power levels 147 of the input laser beams 115.

The output devices 116 may transmit output laser beams 129 off the gain modules 112 in order to at least partially discharge the stored power from the gain modules 112 through the output laser beams 129. The output devices 116 may comprise main resonator outcoupler 128, fully reflecting fold mirrors 132, and high reflector fully reflecting mirror 134. The main resonator outcoupler 128 may comprise partially transmitting mirror 130. The main resonator outcoupler 128 may partially transmit output laser beam 129 comprising main resonator output laser beam 131. The fully reflecting fold mirrors 132 and the high reflector fully reflecting mirror 134 may reflect the transmitted main resonator output laser beam 131 towards the gain modules 112. The reflected main resonator output laser beam 131 may reflect off the gain modules 112 in order to at least partially discharge the stored power from the gain modules 112 through the main resonator output laser beam 131.

The output devices 116 may further comprise helper outcouplers 136, and helper high reflector fully reflecting mirrors 140. The helper outcouplers 136 may comprise partially transmitting mirrors 138. The helper outcouplers 136 may partially transmit output laser beam 129 comprising helper output laser beams 137. The transmitted helper output laser beams 137 may reflect off the gain modules 112. The helper high reflector fully reflecting mirrors 140 may reflect the reflected helper output laser beams 137 back off the gain modules 112 in order to at least partially discharge the stored power from the gain modules 112 through the helper output laser beams 137. In other embodiments, only one or more main resonator outcouplers 128 may be used, and the fully reflecting fold mirrors 132, the high reflector fully reflecting mirror 134, the helper outcouplers 136, and the helper high reflector fully reflecting mirrors 140 may not be necessary. In still other embodiments, any number and type of output devices 116 may be used utilizing varying numbers and types of components to transmit varying numbers and types of output laser beams 129.

Main resonator photo detector 142 may be in communication with main resonator outcoupler 128. The main resonator photo detector 142 may determine the discharge power level 149 of the at least partially discharged stored power discharged from the gain modules 112 through the main resonator output laser beam 131. Helper photo detectors 144 may be in communication with helper outcouplers 136. The helper photo detectors 144 may determine the discharge power level 149 of the at least partially discharged stored power discharged from the gain modules 112 through the helper output laser beams 137.

The at least one computer 118 may comprise at least one database 146, and at least one power reducing routine 148 comprising at least one algorithm 150. The at least one database 146 may be configured to store input power levels 147 of the input laser beams 115 as determined by the reading device 124 and/or detection device 126. The at least one database 146 may also be configured to store discharge power levels 149 of the at least partially discharged stored power discharged from the gain modules 112 through the output laser beams 129, comprising the main resonator output laser beam 131 and the helper output laser beams 137, as determined by the main resonator photo detector 142 and the helper photo detectors 144. The at least one database 146 may also be configured to store a power safety differential limit 151. The at least one algorithm 150 may be configured to calculate a power differential 153 by subtracting the stored discharge power levels 149 from the stored input power level 147, and to at least one of reduce power to and shut down the input devices 114 if the calculated power differential 153 exceeds the power safety differential limit 151.

Figure 3:
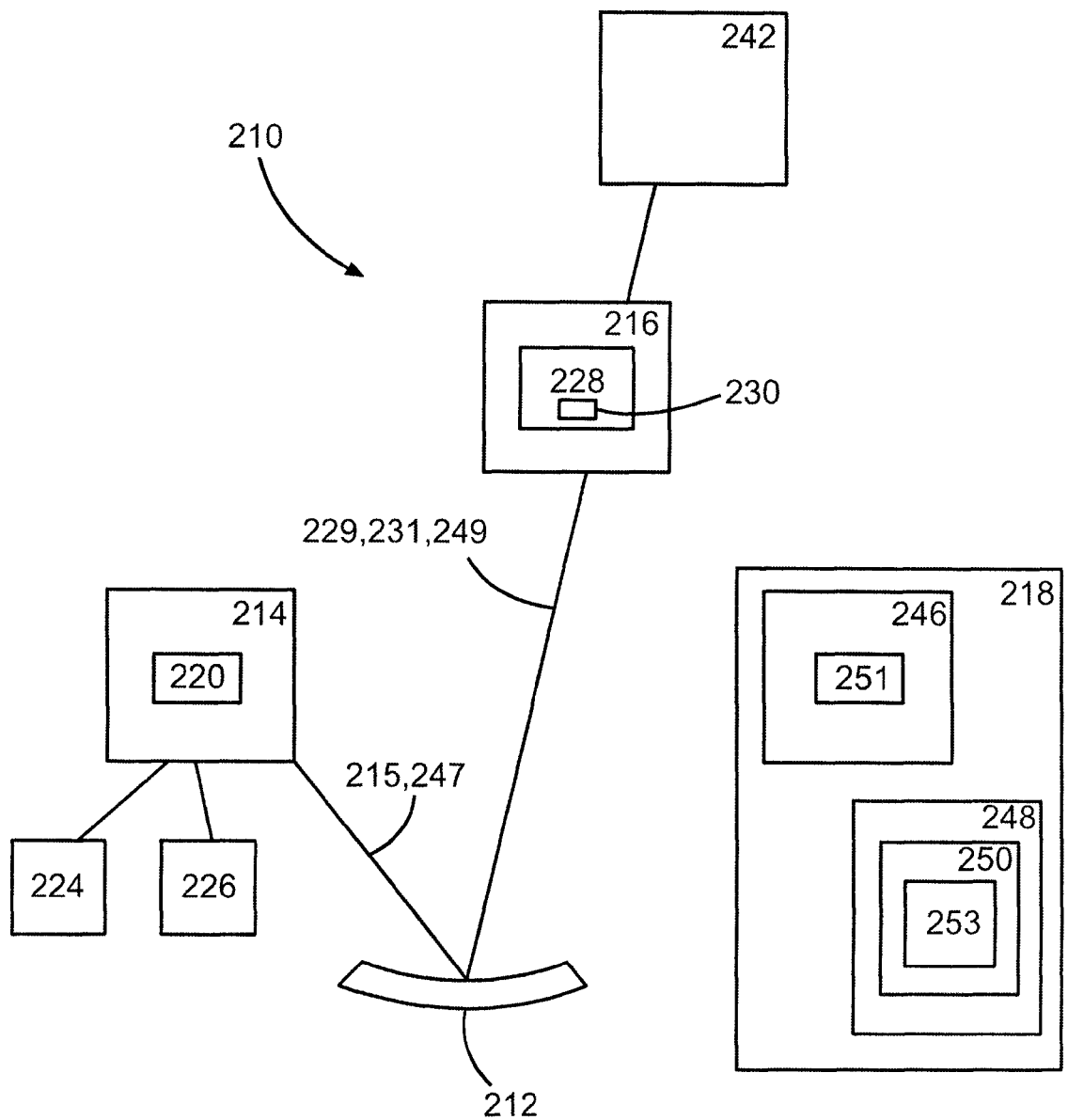
FIG. 3 illustrates a functional box diagram of another embodiment of a laser safety system.

In other embodiments, one or more of the gain modules 112, input devices 114, output devices 116, and the at least one computer 118 may vary in number, type, and/or components. For instance, FIG. 3 illustrates a functional box diagram of another embodiment of a laser safety system 210 having modified components. As shown, the laser safety system 210 may comprise gain module 212, input device 214, output device 216, and computer 218. The gain module 212 may comprise a thin laser disk. In other embodiments, any number of gain modules 212 may be used. The input device 214 may comprise pump module 220. The input device 214 may transmit input laser beam 215 onto gain module 212. The pump module 220 may transmit input laser beam 215. The gain module 212 may absorb the transmitted input laser beam 215 to store power within the gain module 212. In other embodiments, as shown in FIG. 2, any number of pump modules 120 and/or pump mirrors 122 may be utilized. In still other embodiments, any number and type of input device 214 may be used utilizing varying numbers and types of components to transmit varying numbers and types of input laser beam 215. A reading device 224 and/or a detection device 226 may be in communication with the input device 214. The reading device 224 and/or the detection device 226 may be in communication with the pump module 220 for determining the input power level 247 of the input laser beam 215. In other embodiments, varying number and/or types of reading and/or detection devices may be utilized.

The output device 216 may transmit output laser beam 229 off gain module 212 in order to at least partially discharge the stored power from the gain module 212 through the output laser beam 229. The output device 216 may comprise main resonator outcoupler 228. The main resonator outcoupler 228 may comprise partially transmitting mirror 230. The main resonator outcoupler 228 may partially transmit main resonator output laser beam 231 off the gain module 212 in order to at least partially discharge the stored power from the gain module 212 through the main resonator output laser beam 231.

In other embodiments, the output device 216 may utilize varying numbers and types of components to transmit varying numbers and types of output laser beam 229. For instance, in other embodiments, the output device 216 may utilize any number and/or type of the components of the output devices 116 of FIG. 2 including any number and type of fully reflecting fold mirrors 132, any number and type of high reflector fully reflecting mirrors 134, any number and type of gain modules 112, any number and type of helper outcouplers 136, any number and type of helper high reflector fully reflecting mirrors 140, any number and type of output laser beams 129, 131, and 137, and/or other numbers and types of components.

Main resonator photo detector 242 may be in communication with main resonator outcoupler 228. The main resonator photo detector 242 may determine the discharge power levels 249 of the at least partially discharged stored power discharged from the gain module 212 through the main resonator output laser beam 231. In other embodiments, the laser safety system 210 of FIG. 3 may utilize, as shown in FIG. 2, any number and type of main resonator photo detectors 142 and helper photo detectors 144 to determine the discharge power levels of the at least partially discharged stored power discharged from gain modules 112 through output laser beams 129, 131, and 137.

The at least one computer 218 may comprise at least one database 246, and at least one power reducing routine 248 comprising at least one algorithm 250. The at least one database 246 may be configured to store input power levels 247 of the input laser beam 215 as determined by the reading device 224 and/or detection device 226. The at least one database 246 may also be configured to store discharge power levels 249 of the at least partially discharged stored power discharged from the gain module 212 through the output laser beam 229, comprising the main resonator output laser beam 231, as determined by the main resonator photo detector 242. The at least one database 246 may also be configured to store a power safety differential limit 251. The at least one algorithm 250 may be configured to calculate a power differential 253 by subtracting the stored discharge power levels 249 from the stored input power levels 247, and to at least one of reduce power to and shut down the input device 214 if the calculated power differential 253 exceeds the power safety differential limit 251. In other embodiments, the laser safety system 210 of FIG. 3 may utilize, as shown in FIG. 2, any number and type of computers 118, databases 146, power reducing routines 148, algorithms 150, and/or other number and types of components.

Figure 4:
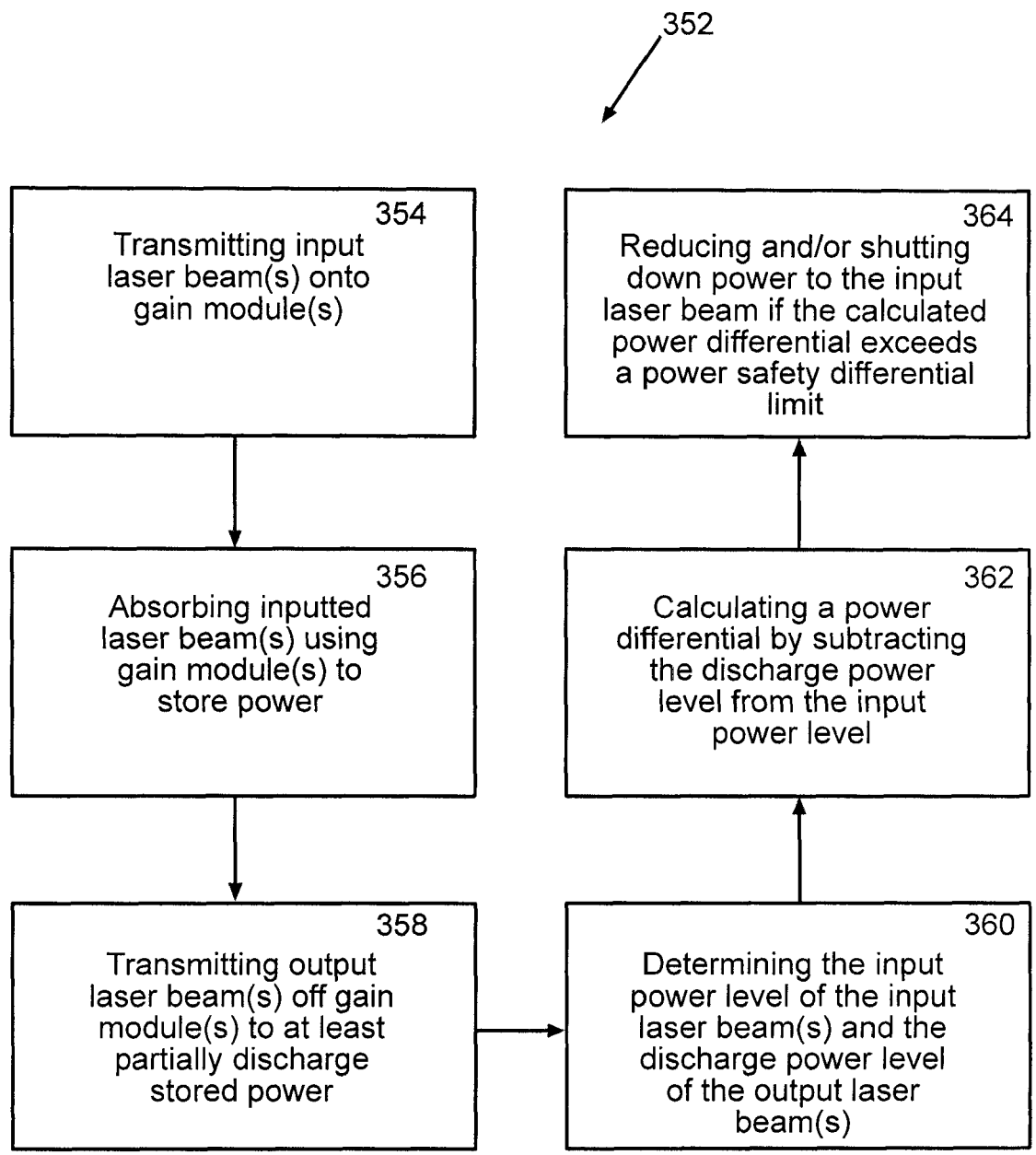
FIG. 4 illustrates a flowchart of one embodiment of a method of operating a laser system.

FIG. 4 illustrates a flowchart of one embodiment of a method 352 of operating a laser system 10, 110, 210. In step 354, at least one input laser beam 115, 215 may be transmitted onto at least one gain module 12, 112, 212. The at least one gain module 12, 112, 212 may comprise at least one thin laser disk. In one embodiment, step 354 may comprise at least one input device 14, 114, 214 transmitting the at least one input laser beam 115, 215 onto the at least one gain module 12, 112, 212. The at least one input device 14, 114, 214 may comprise at least one of a pump module 20, 120, 220 and a pump mirror 22, 122.

In step 356, the at least one transmitted input laser beam 115, 215 may be absorbed using the at least one gain module 12, 112, 212 to store power within the at least one gain module 12, 112, 212. In step 358, at least one output laser beam 129, 229 may be transmitted off the at least one gain module 12, 112, 212 to at least partially discharge the stored power within the at least one gain module 12, 112, 212 through the at least one output laser beam 129, 229. In one embodiment, step 358 may comprise at least one output device 16, 116, 216 transmitting the at least one output laser beam 129, 229, comprising at least one main resonator output laser beam 131, 231, off the at least one gain module 12, 112, 212 to at least partially discharge the stored power within the at least one gain module 12, 112, 212 through the at least one main resonator output laser beam 131, 231. The at least one output device 16, 116, 216 may comprise at least one of a main resonator outcoupler 28, 128, 228 comprising a partially transmitting mirror 30, 130, 230, a fully reflecting fold mirror 32, 132, and a high reflector fully reflecting mirror 34, 134.

In another embodiment, the output device 16, 116, 216 may further comprise at least one of a helper partially transmitting outcoupler 36, 136 comprising a partially transmitting mirror 38, 138, and a helper high reflector fully reflecting mirror 40, 140. Step 358 may further comprise transmitting at least one helper output laser beam 137 using the at least one output device 16, 116, 216 off the at least one gain module 12, 112, 212 to at least partially discharge the stored power within the at least one gain module 12, 112, 212 through the at least one helper output laser beam 137.

In step 360, a determination may be made as to an input power level 147, 247 of the at least one input laser beam 129, 229, and as to a discharge power level 149, 249 comprising the at least partially discharged stored power discharged from the gain modules 12, 112, 212 through the at least one output laser beam 129, 229. In one embodiment, step 360 may comprise determining the input power level 127, 247 of the at least one input laser beam 129, 229 using at least one of a reading device 24, 124, 224 and a detection device 26, 126, 226. In another embodiment, step 360 may comprise determining the discharge power level 149, 249 of the at least one main resonator output laser beam 131, 231 using a main resonator photo detector 42, 142, 242. In still another embodiment, step 360 may comprise determining the discharge power level 149 of the at least one helper output laser beam 137 using the at least one helper photo detector 44, 144.

In step 362, a power differential 153, 253 may be calculated by subtracting the discharge power level 149, 249 from the input power level 147, 247. In one embodiment, step 362 may comprise at least one computer 18, 118, 218 calculating the power differential 153, 253 by subtracting the discharge power level 149, 249 from the input power level 127, 247. In step 364, if the calculated power differential 153, 253 exceeds a power safety differential limit 151, 251, power may be reduced to the at least one input laser beam 115, 215 and/or the at least one input laser beam 115, 215 may be shut down. In one embodiment, step 364 may comprise the at least one computer 18, 118, 218 at least one of reducing power to and shutting down the at least one input laser beam 129, 229 if the calculated power differential 153, 253 exceeds the power safety differential limit 151, 251.

One or more embodiments of the disclosure may provide one or more of the following benefits: reduce the probability of multiple disk failures in the event of a loss of lasing within a high-power resonator; provide for the shut-down of the laser fast enough to preserve the conditions within the gain media directly following damage initiation thus enabling relatively straight forward determination of the root-cause damage mechanism; act to protect high-power system elements and offer a second level of defense against multiple failure scenarios; avoid optical component damage scenarios; allow for significant reduction in laser part-counts through the elimination of "protector-resonators"; and/or may reduce or eliminate other types of problems.

The disclosure has been implemented and is capable of reducing the input pump power and maintaining a safe level for the residual power in the disk within 250 usec for a single violation of the threshold condition. Following the implementation of the fast shutdown system, multiple disk failures within the high-power resonator have not been witnessed.

It should be understood, of course, that the foregoing relates to exemplary embodiments of the disclosure and that modifications may be made without departing from the spirit and scope of the disclosure as set forth in the following claims.

We claim:

1. A laser safety system comprising:
at least one gain module for absorbing at least one input laser beam to store power within said at least one gain module, and for at least partially discharging said stored power through at least one output laser beam;
at least one input device for transmitting said at least one input laser beam onto said at least one gain module;
at least one output device for transmitting said at least one output laser beam off of said at least one gain module in order to at least partially discharge said stored power from said at least one gain module through said at least one output laser beam; and
at least one computer comprising at least one database and at least one power reducing routine, the at least one database configured to store an input power level of the at least one input laser beam, to store a discharge power level of the at least partially discharged stored power discharged through said at least one output laser beam, and to store a power safety differential limit, the at least one power reducing routine comprising at least one algorithm configured to calculate a power differential by subtracting the discharge power level from the input power level, and to at least one of reduce power to and shut down the at least one input device if the calculated power differential exceeds the power safety differential limit.

2. The laser safety system of claim 1 wherein the at least one gain module comprises at least one thin laser disk.

3. The laser safety system of claim 1 wherein the at least one input device comprises at least one pump module.

4. The laser safety system of claim 1 wherein the at least one input device comprises at least one pump mirror.

5. The laser safety system of claim 1 further comprising at least one of a reading device and a detection device for determining the input power level of the at least one input laser beam.

6. The laser safety system of claim 1 wherein the at least one output device comprises a main resonator outcoupler comprising a partially transmitting mirror.

7. The laser safety system of claim 1 wherein the at least one output device comprises at least one fully reflecting fold mirror.

8. The laser safety system of claim 1 wherein the at least one output device comprises at least one high reflector fully reflecting mirror.

9. The laser safety system of claim 1 further comprising a main resonator photo detector for determining said discharge power level of the at least partially discharged stored power discharged through said at least one output laser beam comprising a main resonator output laser beam.

10. The laser safety system of claim 1 wherein the at least one output device comprises at least one helper outcoupler comprising at least one partially transmitting mirror for partially transmitting at least one helper output laser beam to the at least one gain module to at least partially discharge said stored power through said at least one helper output laser beam.

11. The laser safety system of claim 10 wherein the at least one output device comprises at least one helper high reflector fully reflecting mirror for fully reflecting the at least one helper output laser beam to the at least one gain module.

12. The laser safety system of claim 10 further comprising at least one helper photo detector for determining the discharge power level of the at least partially discharged stored power discharged from said at least one gain module through said at least one helper output laser beam.

13. The laser safety system of claim 1 wherein the at least one input device comprises at least one of a pump module and a pump mirror, the at least one output device comprises at least one of a main resonator partially transmitting mirror outcoupler, a fully reflecting fold mirror, and a high reflector fully reflecting mirror, and the laser safety system further comprises a main resonator photo detector for determining said discharge power level of the at least partially discharged stored power discharged through said at least one output laser beam comprising a main resonator output laser beam.

14. The laser safety system of claim 13 wherein the at least one output device further comprises at least one of a helper partially transmitting mirror outcoupler for partially transmitting at least one helper output laser beam to the at least one gain module to at least partially discharge said stored power through said at least one helper output laser beam, and a helper high reflector fully reflecting mirror for fully reflecting the at least one helper output laser beam to the at least one gain module, and the laser safety system further comprises at least one helper photo detector for determining the discharge power level of the at least partially discharged stored power discharged from said at least one gain module through said at least one helper output laser beam.

15. A method of operating a laser system comprising:
transmitting at least one input laser beam onto at least one gain module;
absorbing said transmitted at least one input laser beam using said at least one gain module to store power within said at least one gain module;
transmitting at least one output laser beam off said at least one gain module to at least partially discharge the stored power within said at least one gain module through said at least one output laser beam;
determining an input power level of the at least one input laser beam, and a discharge power level comprising the at least partially discharged stored power discharged through said at least one output laser beam;
calculating a power differential by subtracting the discharge power level from the input power level; and
at least one of reducing power to and shutting down the at least one input laser beam if the calculated power differential exceeds a power safety differential limit.

16. The method of claim 15 wherein the transmitting the at least one input laser beam step comprises at least one input device transmitting said at least one input laser beam onto said at least one gain module, the at least one input device comprising at least one of a pump module and a pump mirror.

17. The method of claim 15 wherein the at least one gain module comprises at least one thin laser disk.

18. The method of claim 15 wherein the transmitting the at least one output laser beam step comprises at least one output device transmitting said at least one output laser beam, comprising at least one main resonator output laser beam, off said at least one gain module to at least partially discharge the stored power within said at least one gain module through said at least one main resonator output laser beam, the at least one output device comprising at least one of a main resonator outcoupler comprising a partially transmitting mirror, a fully reflecting fold mirror, and a high reflector fully reflecting mirror.

19. The method of claim 18 wherein the at least one output device further comprises at least one of a helper partially transmitting outcoupler comprising a partially transmitting mirror, and a helper high reflector fully reflecting mirror, wherein the transmitting the at least one output laser beam step further comprises transmitting at least one helper output laser beam using the at least one output device off said at least one gain module to at least partially discharge the stored power within said at least one gain module through said at least one helper output laser beam.

20. The method of claim 15 wherein the determining step comprises determining the input power level of the at least one input laser beam using at least one of a reading device and a detection device.

21. The method of claim 18 wherein the determining step comprises determining the discharge power level of the at least one main resonator output laser beam using a main resonator photo detector.

22. The method of claim 19 wherein the determining step comprises determining the discharge power level of the at least one helper output laser beam using at least one helper photo detector.

23. The method of claim 15 wherein the calculating step comprises at least one computer calculating the power differential by subtracting the discharge power level from the input power level.

24. The method of claim 23 wherein the at least one of step comprises the at least one computer at least one of reducing power to and shutting down the at least one input laser beam if the calculated power differential exceeds the power safety differential limit.

25. At least one computer comprising:
at least one database and at least one power reducing routine, the at least one database configured to store an input power level of at least one input laser beam transmitted onto and storing power within at least one gain module, to store a discharge power level of at least partially discharged stored power discharged from the at least one gain module through at least one output laser beam, and to store a power safety differential limit, the at least one power reducing routine comprising at least one algorithm configured to calculate a power differential by subtracting the discharge power level from the input power level, and to at least one of reduce power to and shut down the at least one input laser beam if the calculated power differential exceeds the power safety differential limit.

* * * * *